(12) United States Patent
Reohr et al.

(10) Patent No.: US 7,046,550 B1
(45) Date of Patent: May 16, 2006

(54) CROSS-POINT MEMORY ARCHITECTURE WITH IMPROVED SELECTIVITY

(75) Inventors: William Robert Reohr, Ridgefield, CT (US); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/037,707

(22) Filed: Jan. 18, 2005

(51) Int. Cl.
*G11C 16/04* (2006.01)

(52) U.S. Cl. .................................. 365/185.13; 365/202
(58) Field of Classification Search ........... 365/185.13, 365/202
See application file for complete search history.

(56) References Cited

U.S. PATENT DOCUMENTS

| | | | | |
|---|---|---|---|---|
| 5,973,984 A | * | 10/1999 | Nagaoka ................ | 365/230.03 |
| 6,449,204 B1 | * | 9/2002 | Arimoto et al. ............ | 365/222 |
| 6,683,810 B1 | * | 1/2004 | Sakamoto .............. | 365/185.22 |
| 6,816,405 B1 | * | 11/2004 | Lu et al. ...................... | 365/171 |
| 6,937,535 B1 | * | 8/2005 | Ahn et al. ............. | 365/189.04 |

OTHER PUBLICATIONS

Y-C. Chen et al., "An Access-Transistor-Free (0T/1R) Non-Volatile Resistance Random Access Memory (RRAM) Using a Novel Threshold Switching, Self-Rectifying Chalcogenide Device," IEEE IEDM 2003, pp. 37.4.1-37.4.4, 2003.

Y.N. Hwang et al., "Writing Current Reduction for High-density Phase-change RAM," IEEE IEDM 2003, pp. 37.1.1-37.1.4, 2003.

W. Reohr et al., "Memories of Tomorrow," IEEE Circuits & Devices Magazine, vol. 18, No. 5, pp. 17-27, Sep. 2002.

* cited by examiner

*Primary Examiner*—Tuan T. Nguyen
(74) *Attorney, Agent, or Firm*—Wan Yee Cheung, Esq.; Ryan, Mason & Lewis, LLP

(57) ABSTRACT

A cross-point memory includes a plurality of memory cells, a plurality of global word lines, a plurality of local word lines, and a plurality of global bit lines. At least a given one of the global word lines is configurable for conveying a write current for selectively writing a logical state of one or more of the memory cells. Each of the local word lines is connected to at least one of the memory cells for assisting in writing a logical state of the at least one memory cell corresponding thereto. Each of the global bit lines is connected to at least one of the memory cells for writing a logical state of the memory cell corresponding thereto. The memory further includes a plurality of selection circuits, each of the selection circuits being operative to electrically connect a given one of the local word lines to a given one of the global word lines in response to a control signal applied thereto. During a write operation directed to at least one selected memory cell, the write current passes through the selected memory cell for writing the logical state of the selected memory cell.

17 Claims, 6 Drawing Sheets

US 7,046,550 B1

CROSS-POINT MEMORY ARCHITECTURE WITH IMPROVED SELECTIVITY

FIELD OF THE INVENTION

The present invention relates generally to memory devices, and more particularly relates to a memory architecture employing segmentation for improving write selectivity in a cross-point memory array.

BACKGROUND OF THE INVENTION

Various memory architectures have been proposed for selectively reading and/or writing one or more memory cells in a memory array. Of all of the various memory configurations that have been proposed, however, cross-point memory architectures typically offer one of the most dense memory configurations. However, while cross-point memory architectures may offer a significant density advantage compared to other alternative memory architectures, cross-point memory architectures also present many disadvantages, due primarily to an inherent lack of selectivity within the memory array. This lack of selectivity is attributable, at least in part, to the fact that each memory cell in the cross-point memory array essentially consists of only a nonvolatile memory element, without a local switching element to electrically isolate the individual memory cells from corresponding bit lines and/or word lines in the array.

In order to increase storage density in a cross-point memory array, it is known to stack multiple layers of memory cells on top of one another. For example, the Matrix® 3-D Memory (3DM) product line manufactured by Matrix Semiconductor, Inc., employs standard semiconductor materials and process technology to build circuitry in multiple, active memory layers within a silicon die to provide a high-density, nonvolatile data storage device. However, the Matrix® 3DM is a one-time-programmable (OTP) memory, and is therefore not suitable for most data storage applications which typically require multiple write operations directed to the memory.

There exists a need, therefore, for a memory architecture suitable for use in a cross-point memory array which does not suffer from one or more of the above-noted deficiencies associated with conventional memory architectures.

SUMMARY OF THE INVENTION

In accordance with the aforementioned need, the present invention, in an illustrative embodiment thereof, is an improved cross-point memory array that utilizes a unique segmentation architecture to improve selectivity within the array.

In accordance with one aspect of the invention, a cross-point memory includes a plurality of memory cells, a plurality of global word lines, a plurality of local word lines, and a plurality of global bit lines. At least a given one of the global word lines is configurable for conveying a write current for selectively writing a logical state of one or more of the memory cells. Each of the local word lines are connected to at least one of the memory cells for assisting in writing a logical state of the at least one memory cell corresponding thereto. Each of the global bit lines is connected to at least one of the memory cells for writing a logical state of the memory cell corresponding thereto. The memory further includes a plurality of selection circuits, each of the selection circuits being operative to electrically connect a given one of the local word lines to a corresponding global word lines in response to a control signal applied thereto. During a write operation directed to at least one selected memory cell, the memory is configured such that the write current passes through the selected memory cell for writing the logical state of the selected memory cell.

In accordance with another aspect of the invention, the memory is configured such that, during a write operation for writing at least a given one of the memory cells, global bit lines corresponding to unselected memory cells charge local word lines corresponding to the unselected memory cells to a standby voltage, whereby each of the unselected memory cells has substantially zero volts across it.

These and other objects, features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative memory architecture for improving write selectivity in a cross-point memory array comprising a plurality of nonvolatile memory cells. It should be appreciated, however, that the invention is not limited to this or any particular memory architecture. Rather, the invention is more generally applicable to a cross-point memory array which is advantageously segmented so as to provide isolated access to a certain specified subset(s) of memory cells in the array. In addition to providing increased write selectivity within the memory array, the techniques of the present invention described herein may be used to reduce power consumption, increase yield, and/or reduce write access times in the array.

Figure 1:
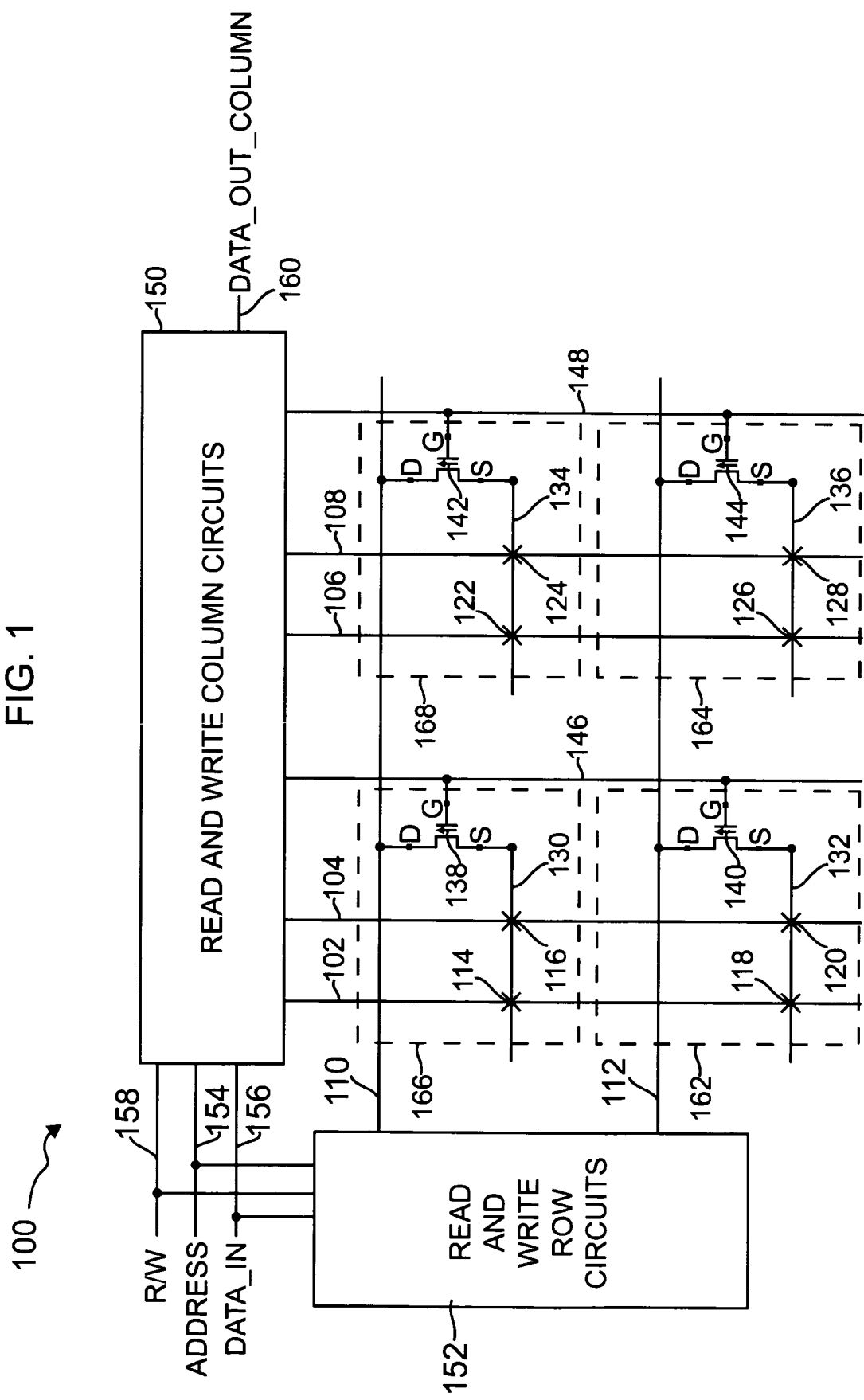
FIG. 1 is a schematic diagram illustrating at least a portion of an exemplary cross-point memory, formed in accordance with one embodiment of the present invention.

FIG. 1 is a schematic diagram depicting an exemplary cross-point memory 100, formed in accordance with an illustrative embodiment of the invention. The exemplary cross-point memory 100 includes a plurality of nonvolatile memory cells 114, 116, 118, 120, 122, 124, 126 and 128. Each of the memory cells 114 through 128 preferably comprises a phase change memory (PCM) element (e.g., chalcogenide device) for storing a logical state of the memory cell. As is known by those skilled in the art, PCM exploits thermally reversible changes in a crystal structure of, for example, chalcogenide glass ($Ge_xSb_yTe_z$). By heating the PCM element to above its melting point (e.g., above about 600 degrees Celsius (C.)), and then rapidly cooling to avoid/minimize crystallization, a high-resistance amorphous state is formed. Alternatively, by heating the PCM element to above a glass transition temperature (e.g., about 300 degrees C.) but below its melting point, and then cooling more slowly to promote crystallization, a lower resistance polycrystalline state is formed. Typically, the difference in resistance between the amorphous and polycrystalline states (generally on the order of about 100 to 1) of the PCM element can be sensed, for example, by sense circuitry (e.g., sense amplifiers) which may be included in the memory. Another PCM element that switches between two amorphous states only provides self-rectification that is well-suited to cross-point memories, because the on/off current ratio can be greater than about 1000. A cross-point memory (RAM) utilizing such PCM cells is described in a paper by Yi-Chou Chen et al., entitled "An Access-Transistor-Free (OT/1R) Non-Volatile Resistance Random Access Memory (RRAM) Using a Novel Threshold Switching, Self-Rectifying Chalcogenide Device," *IEDM* 2003 *Technical Digest*, pp. 37.4.1–37.4.4 (December 2003), the disclosure of which is incorporated by reference herein.

The cross-point memory 100 further includes a plurality of global bit lines 102, 104, 106 and 108, and a plurality of global word lines 110 and 112, for selectively accessing one or more memory cells in the cross-point memory array. The global bit lines 102, 104, 106, 108 are preferably arranged substantially vertically, such as in a column orientation, and may therefore be referred to herein as global column lines. Likewise, the global word lines are preferably arranged substantially orthogonal to the bit lines, such as in a row orientation, and may therefore be referred to herein as global row lines. It is to be appreciated, however, that the present invention is not limited to the specific configuration of the global column lines and global row lines shown. Rather, various alternative arrangements of the global column lines and global row lines are contemplated by the invention. For instance, the respective orientations of the global column lines and global row lines may be interchanged, such that the global column lines are arranged in a substantially horizontal dimension and the global row lines are arranged in a substantially vertical dimension. The techniques of the present invention may be similarly applied to this alternative memory configuration for obtaining an improvement in write selectivity, as well as for achieving other beneficial characteristics.

In accordance with an important aspect of the invention, the memory cells 114 through 128 are preferably arranged into a plurality of segmented groups 162, 164, 166 and 168, each of the segmented groups including one or more memory cells, a local word line, also referred to as a local row line (e.g., 130, 132, 134, 136) since the local word lines are preferably oriented in a substantially horizontal dimension, and a selection transistor (e.g., 138, 140, 142, 144), or alternative switching circuit (e.g., multiplexer, pass gate, etc.). The selection transistor in each of the segmented groups selectively connects the local row line to a corresponding global row line in response to a control signal applied to a gate terminal (G) of the transistor. By selectively disabling or enabling one of the plurality of selection transistors via a corresponding control signal, the local row line corresponding thereto can be electrically isolated from or electrically connected to, respectively, the corresponding global row line. Read and write operations directed to the memory cells in the memory array may access different numbers of these local row lines at any one time by enabling one or more of the selection transistors connected to the global row lines for each operation. In any case, the cross-point memory 100 of the present invention is effectively partitioned into active and standby regions, as will be explained in further detail below. It is to be appreciated that the present invention is not limited to any particular number of segmented groups, nor is it limited to any particular number of memory cells in a given one of the segmented groups. Additionally, the segmented groups need not each contain the same number of memory cells.

Specifically, segmented group 162 includes memory cells 118 and 120, which are connected, at a first terminal, to local row line 132. Local row line 132 is connected to a source terminal (S) of selection transistor 140, which may be an n-type metal-oxide semiconductor (NMOS) device. A drain terminal (D) of selection transistor 140 is connected to corresponding global row line 112. The gate terminal of transistor 140 is connected to a global enable line 146 for selectively isolating (or connecting) the local row line 132 from (or to) the corresponding global row line 112. Memory cells 118 and 120 are also connected, at a second terminal, to global column lines 102 and 104, respectively. Segmented group 164 includes memory cells 126 and 128, which are connected, at a first terminal, to local row line 136. Local row line 136 is connected to a source terminal of selection transistor 144. A drain terminal of selection transistor 144 is connected to corresponding global row line 112. The gate terminal of transistor 144 is connected to a global enable line 148 for selectively isolating (or connecting) the local row line 136 from (or to) the corresponding global row line 112. Memory cells 126 and 128 are also connected, at a second terminal, to global column lines 106 and 108, respectively.

Segmented group 166 includes memory cells 114 and 116, which are connected, at a first terminal, to local row line 130. Local row line 130 is connected to a source terminal of selection transistor 138, which, like the other selection transistors, may comprise an NMOS device. A drain terminal of selection transistor 138 is connected to corresponding global row line 110. The gate terminal of transistor 138 is connected to the global enable line 146 for selectively isolating (or connecting) the local row line 130 from (or to) the corresponding global row line 110. Memory cells 114 and 116 are also connected, at a second terminal, to global column lines 102 and 104, respectively. Segmented group 168 includes memory cells 122 and 124, which are connected, at a first terminal, to local row line 134. Local row line 134 is connected to a source terminal of selection transistor 142. A drain terminal of selection transistor 142 is connected to corresponding global row line 110. The gate terminal of transistor 142 is connected to the global enable line 148 for selectively isolating (or connecting) the local row line 134 from (or to) the corresponding global row line 110. Memory cells 122 and 124 are also connected, at a second terminal, to global column lines 106 and 108, respectively.

As apparent from the figure, a given global row line (e.g., 112) may be shared by a plurality of corresponding segmented groups (e.g., 162, 164). Likewise, a given global column line (e.g., 102) may be shared by a plurality of corresponding segmented groups (e.g., 162, 166). However, although more than one memory cell may share a common local row line or a global column line, the exemplary cross-point memory 100 is preferably configured such that a given one of the memory cells is written by selecting a combination of a global column line and a local row line uniquely corresponding to that memory cell. For example, memory cell 114 may be accessed by selecting a combination of global column line 102 and local row line 130, and this combination cannot be used to access any of the other memory cells in the array.

As previously stated, each of the memory cells 114 through 128 in exemplary cross-point memory 100 preferably comprises a PCM element for storing the logical states of the memory cells. To provide the localized heating required to change the crystalline state of a given PCM element during a write operation, a write current must pass through one or more selected memory cells to be written. During the write operation, this write current is preferably supplied/returned by one or more read and write column circuits 150 and one or more read and write row circuits 152 comprised in the exemplary cross-point memory 100. The write current supplied/returned by the column circuit 150 is conveyed along the global column lines 102, 104, 106, 108. Similarly, write current supplied/returned by the row circuit 152 is conveyed along the global row lines 110, 112 and corresponding local row lines 130, 132, 134, 136, via selection transistors 138, 140, 142, 144, respectively. It is to be appreciated that unless a corresponding selection transistor has been enabled for a given segmented group, write current will not pass through the one or more memory cells associated with that segmented group, thereby preventing a write of these memory cells.

The column and row circuits 150, 152 are preferably configured to generate selected voltage levels on each of the global column lines and global row lines, respectively, in response to an address conveyed by an address bus 154 presented to the column and row circuits. Data to be written to the selected memory cells is preferably conveyed by a Data_In bus 156 presented to the column and row circuits 150, 152. Data read out from the memory cells in a column dimension is preferably conveyed by a Data_Out_Column bus 160 connected to the column circuit 150. A control signal supplied to a read/write (R/W) input 158 connected to the column and row circuits 150, 152, is preferably used to select whether the cross-point memory 100 is operational in either a read mode or a write mode.

Figure 2:
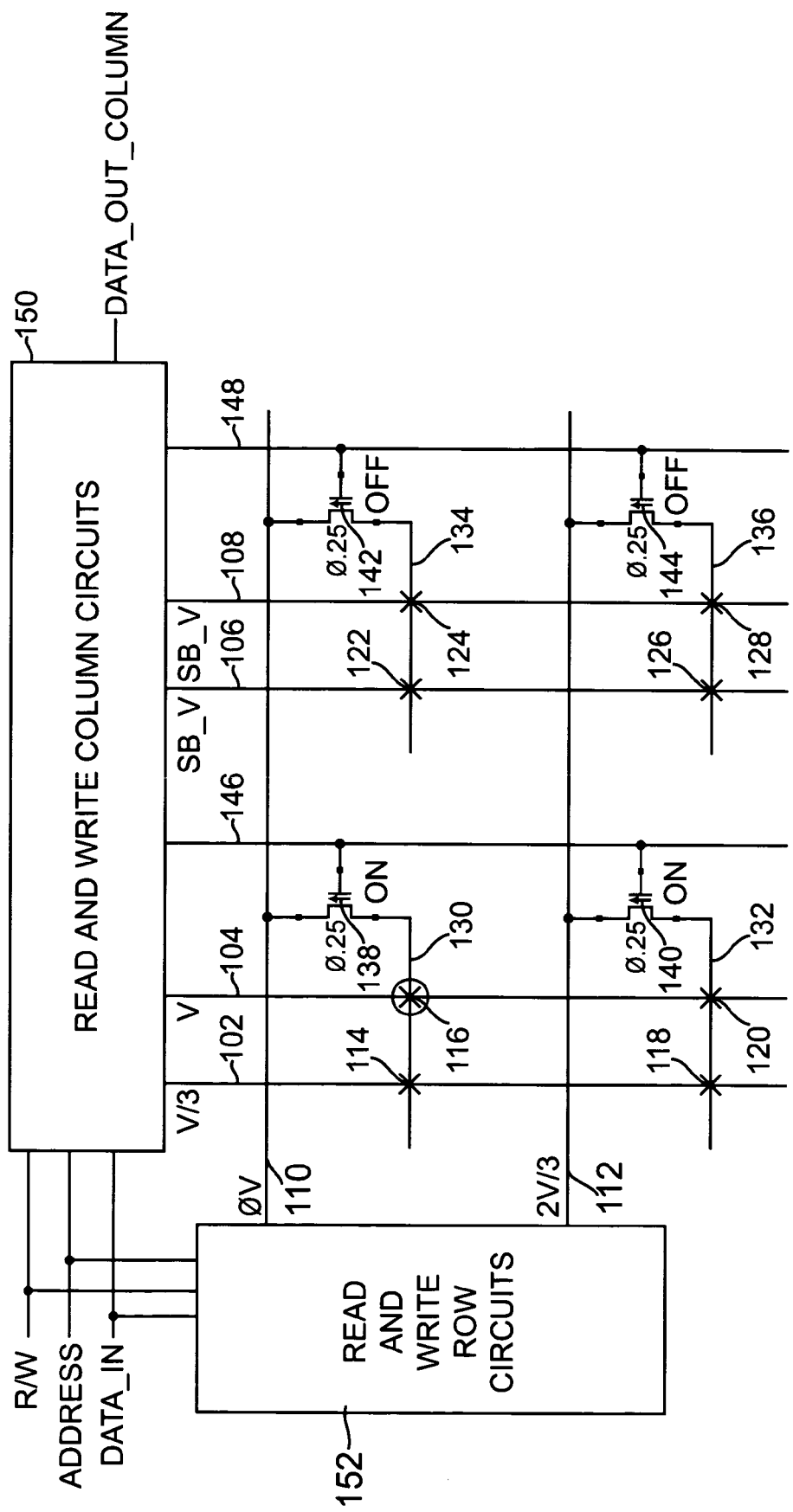
FIG. 2 is a schematic diagram depicting the illustrative cross-point memory shown in FIG. 1, configured for an exemplary write operation.

With reference to FIG. 2, an exemplary write operation directed to a selected memory cell 116 in the illustrative cross-point memory 100 will now be described, by way of example only and without loss of generality. As shown in FIG. 2, in order to write a given memory cell (e.g., 116) to a desired logical state, a specified voltage potential V is applied across the memory cell. The voltage V may be chosen so as to place the PCM element comprised in a selected memory cell into a polycrystalline state or one or more amorphous states representative of the desired logical state to be stored, namely, either a "0" or a "1." In this instance, memory cell 116 may be written by applying a full voltage potential V to the corresponding global column line 104, and substantially concurrently applying zero volts to the corresponding local row line 130 to which the selected cell is connected, via selection transistor 138 and global row line 110.

In order to enable selection transistor 138, an active signal must be applied to the global enable line 146 corresponding to local row line 130. However, enabling selection transistor 138 will enable all other selection transistors (e.g., 140) connected to the global enable line 146, thereby electrically connecting the memory cells corresponding to local row line 132 to their corresponding global row line 112. Consequently, the row circuit 152 must be configured so as to ensure that the voltages applied to the other global row lines not corresponding to the selected memory cell 116 do not equal zero volts, so as to prevent the full voltage potential V from being applied across unintended memory cells. Rather, the row circuit 152 preferably sets the voltage on the remaining global row lines 112 to be equal to 2V/3.

For example, consider memory cell 120 which shares the same global column line 104 as selected memory cell 116, and is therefore considered to be partially-selected. Since memory cell 120 is connected to global column line 104, memory cell 120 will also receive a voltage V at one of its terminals. However, the local row line 132 corresponding to memory cell 120, which will be connected to corresponding global row line 112 via selection transistor 140, is biased to a voltage 2V/3, so that memory cell 120 will have a voltage of V−2V/3=V/3 across it. The voltage V/3, which may be considered a partial-select voltage, is preferably chosen so as to ensure that the state of the memory cell remains unchanged over a desired range of process, voltage and/or temperature (PVT) variations.

Likewise, consider memory cell 118, which does not share the same global column line 104 as the selected memory cell 116 but rather is connected to global column line 102. Memory cell 118 will receive a voltage V/3 at one of its terminals, from global column line 102, and a voltage of 2V/3 at another of its terminals, via corresponding global row line 112, local row line 132 and selection transistor 140. Thus, the voltage across memory cell 118 will be V/3−2V/3=−V/3. This write operation may be referred to as a ⅓-method. While the present invention contemplates that other voltage configurations may be employed for the cross-point memory 100 (e.g., a ½-method), since at most a voltage of V/3 will be applied across partially-selected memory cells in the memory array, a likelihood of disturbing these memory cells is significantly reduced compared to alternative write schemes.

Although not shown, a ½-method write scheme is similarly contemplated by the present invention, wherein the maximum voltage applied to partially-selected memory cells is V/2. Using the ½-method write approach, the voltages on the global column line 104 and global row line 110 corresponding to the selected memory cell 116 are the same as for the ⅓-method write scheme, namely, voltage potentials V and 0, respectively. However, global column lines not connected to the selected memory cell (e.g., global column line 102) are biased to a voltage of V/2, rather than V/3 as in the ⅓-method. Moreover, global row lines not associated with the selected memory cell (e.g., global row line 112) are biased to a voltage of V/2, rather than 2V/3 as in the ⅓-method approach. Thus, a magnitude of V/2 volts will be applied across partially-selected memory cells 114 and 120 sharing a common global column line 104 or a common global row line 110 corresponding to the selected memory cell 116. The voltage across memory cell 118 will be zero, since it shares neither a common global column line nor a common global row line with the selected memory cell 116.

It is to be understood that, with regard to the other memory cells in the memory array, such as memory cells 122, 124, 126, 128, not associated with the same global enable line 146 as the selected memory cell 116, these other memory cells are considered to be unselected memory cells. The unselected memory cells 122, 124, 126, 128 are electrically isolated from any of the global row lines via disabled selection transistors 142, 144, and consequently the current consumption attributable to the unselected memory cells is substantially equal to zero. The global column lines 106, 108 corresponding to the unselected memory cells 122, 124, 126, 128 may be set to essentially any voltage. Preferably, global column lines 106, 108 are biased to a standby voltage SB_V. The standby voltage SB_V is preferably chosen so as to ensure that a selected memory cell being read is not inadvertently written during the read operation. Local row lines corresponding to these unselected memory cells 122, 124, 126, 128 will be biased to the standby voltage SB_V of the global column lines 106, 108 via the conductance of the respective memory cells connected thereto. By utilizing local row lines (e.g., 130, 132, 134, 136) to at least partially segment the memory array into regions of unselected memory cells, as well as selected or partially-selected memory cells, a significant reduction in power consumption in the cross-point memory 100 can be achieved.

Figure 3:
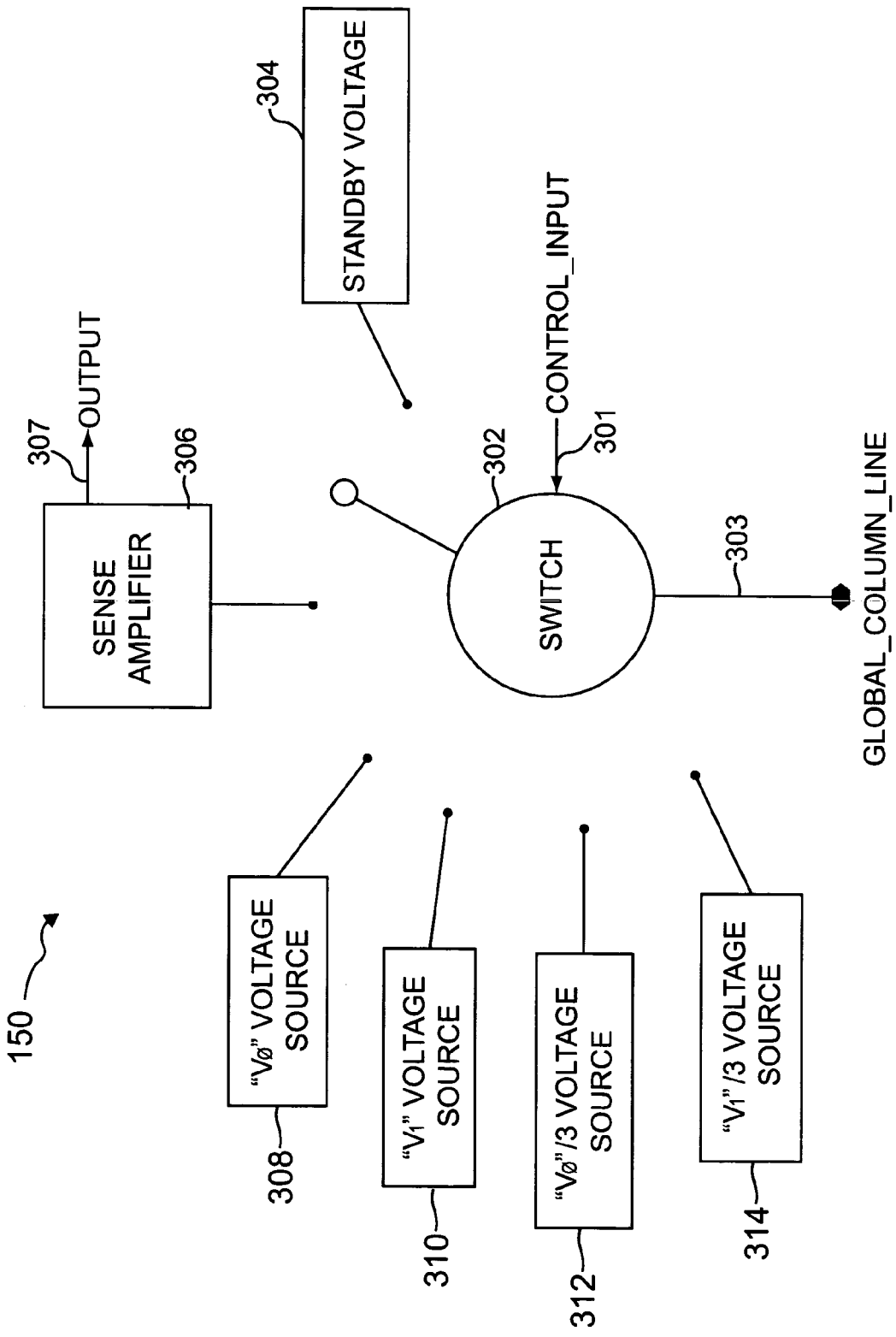
FIG. 3 is a block diagram illustrating at least a portion of an exemplary read and write column line circuit, formed in accordance with an illustrative embodiment of the invention.
Figure 4:
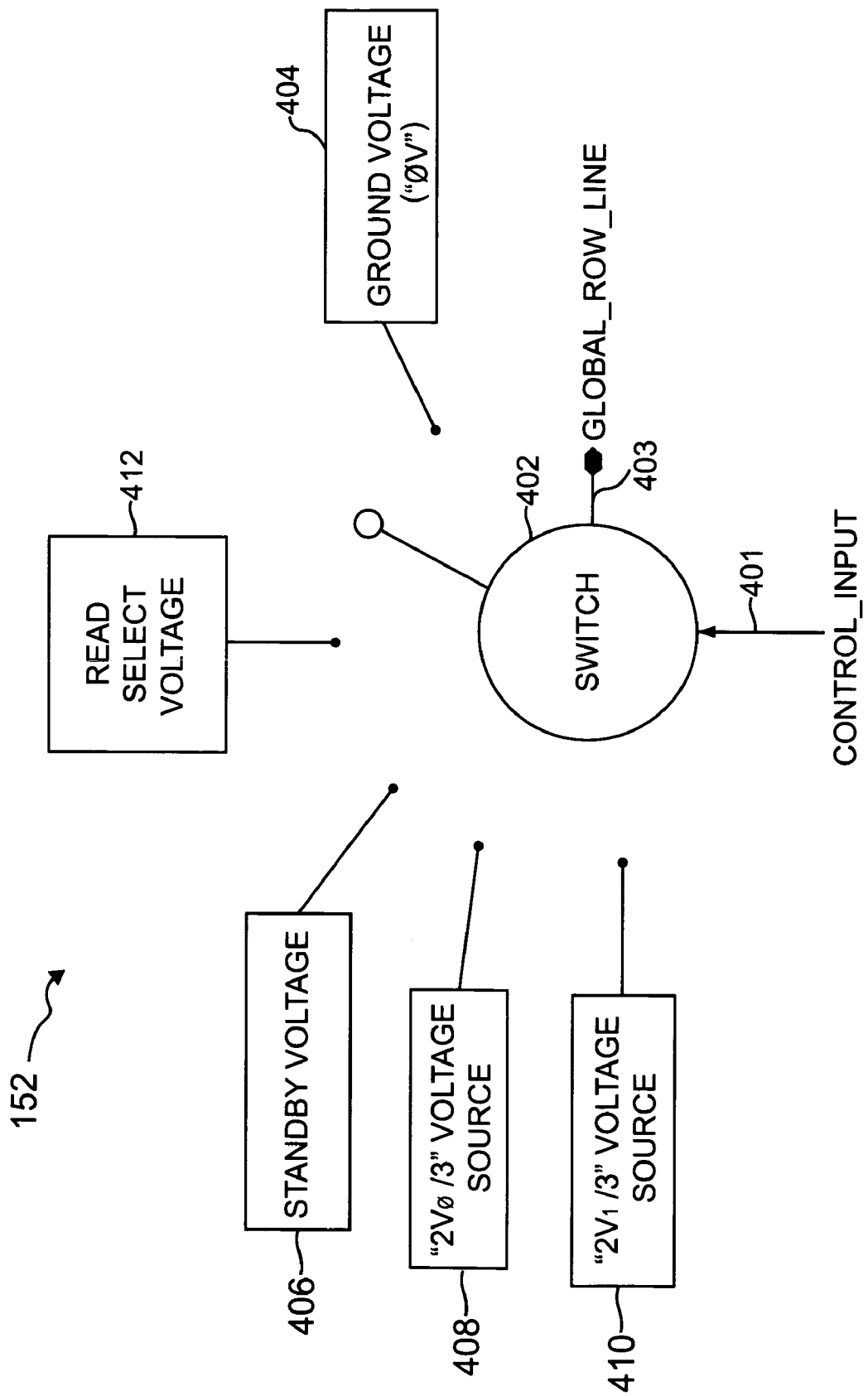
FIG. 4 is a block diagram illustrating at least a portion of an exemplary read and write row line circuit, formed in accordance with an illustrative embodiment of the invention.

FIGS. 3 and 4 depict exemplary column and row circuits, respectively, configured for use with the ⅓-method described above. With regard to these figures, $V_1$ is preferably defined as the voltage for writing a logical "1" into at least a given one of the memory cells, and $V_0$ may be defined as the voltage for writing a logical "0" into the memory cell. It is to be understood that, with reference to FIG. 2, the voltage V is actually representative of either the voltage $V_0$ or $V_1$.

FIG. 3 is a block diagram illustrating an exemplary read and write column circuit 150 which may be utilized in conjunction with the cross-point memory 100 depicted in FIG. 1, in accordance with the present invention. The read and write column circuit 150 is shown conceptually as comprising a switch 302 having a terminal 303 which is selectively connectable to one of a plurality of voltage sources 304, 308, 310, 312, 314, or to a sense amplifier 306, in response to one or more control signals applied to a control input 301 of the switch. Terminal 303 is preferably connected to one of the global column lines (e.g., 102, 104, 106 or 108), and the control signal(s) applied to control input 301 is(are) preferably derived from a combination of inputs to the cross-point memory 100 shown in FIG. 1, including, but not limited to, R/W, Data_In, and Address. In practice, although not shown, the switch 302 may be implemented, for example, as a multiplexer (MUX), or alternative selection circuitry. Additionally, the plurality of voltage sources 304, 308, 310, 312, 314 may alternatively be implemented, for example, as a single programmable voltage source (not shown) configurable for generating one of multiple voltage levels in response to a control signal applied thereto, as will be understood by those skilled in the art.

During a write operation, the switch 302 may be selectively connected to one of standby voltage source 304, $V_0$ voltage source 308, $V_1$ voltage source 310, $V_0/3$ voltage source 312 and $V_1/3$ voltage source 314, depending upon whether the global column line to which the column circuit 150 may be connected corresponds to a selected memory cell, an unselected memory cell, or a partially-selected memory cell, as described above. By way of example only, when terminal 303 is connected to a global column line corresponding to unselected memory cells, the switch 302 is preferably operative to connect the standby voltage source 304 to terminal 303. When the global column line corresponds to a selected memory cell, switch 302 is preferably operative to connect either the $V_0$ voltage source 308 or the $V_1$ voltage source 310 to terminal 303, depending on whether a logical "0" or "1," respectively, is to be written into the selected memory cell. Likewise, when the global column line corresponds to a partially-selected memory cell, switch 302 is preferably operative to connect either the $V_0/3$ voltage source 312 or the $V_1/3$ voltage source 314 to terminal 303.

FIG. 4 is a block diagram illustrating an exemplary read and write row circuit 152 which may be utilized in conjunction with the cross-point memory 100 depicted in FIG. 1, in accordance with the present invention. The read and write row circuit 152 is shown conceptually as comprising a switch 402 having a terminal 403 which is selectively connectable to one of a plurality of voltage sources 404, 406, 408, 410 and 412, in response to one or more control signals applied to a control input 401 of the switch. Terminal 403 is preferably connected to one of the global row lines (e.g., 110 or 112), and the control signal(s) applied to control input 401 is(are) preferably derived from a combination of inputs to the cross-point memory 100 shown in FIG. 1, including, but not limited to, R/W, Data_In, and Address. In practice, switch 402, like switch 302 depicted in FIG. 3, may comprise, for example, a multiplexer (MUX), or alternative selection circuitry.

By way of example only, during a write operation, the switch 402 may be selectively connected to one of ground (zero) voltage source 404, standby voltage source 406, $2V_0/3$ voltage source 408 and $2V_1/3$ voltage source 410, depending upon whether the global row line to which the row circuit 152 may be connected corresponds to a selected memory cell, an unselected memory cell, or a partially-selected memory cell. When the global row line corresponds to a selected memory cell, switch 402 is preferably operative to connect the ground (zero) voltage source 404 to terminal 403. Likewise, when the global row line corresponds to a partially-selected memory cell, switch 402 is preferably operative to connect either the $2V_0/3$ voltage source 408 or the $2V_1/3$ voltage source 410 to terminal 403.

Figure 5:
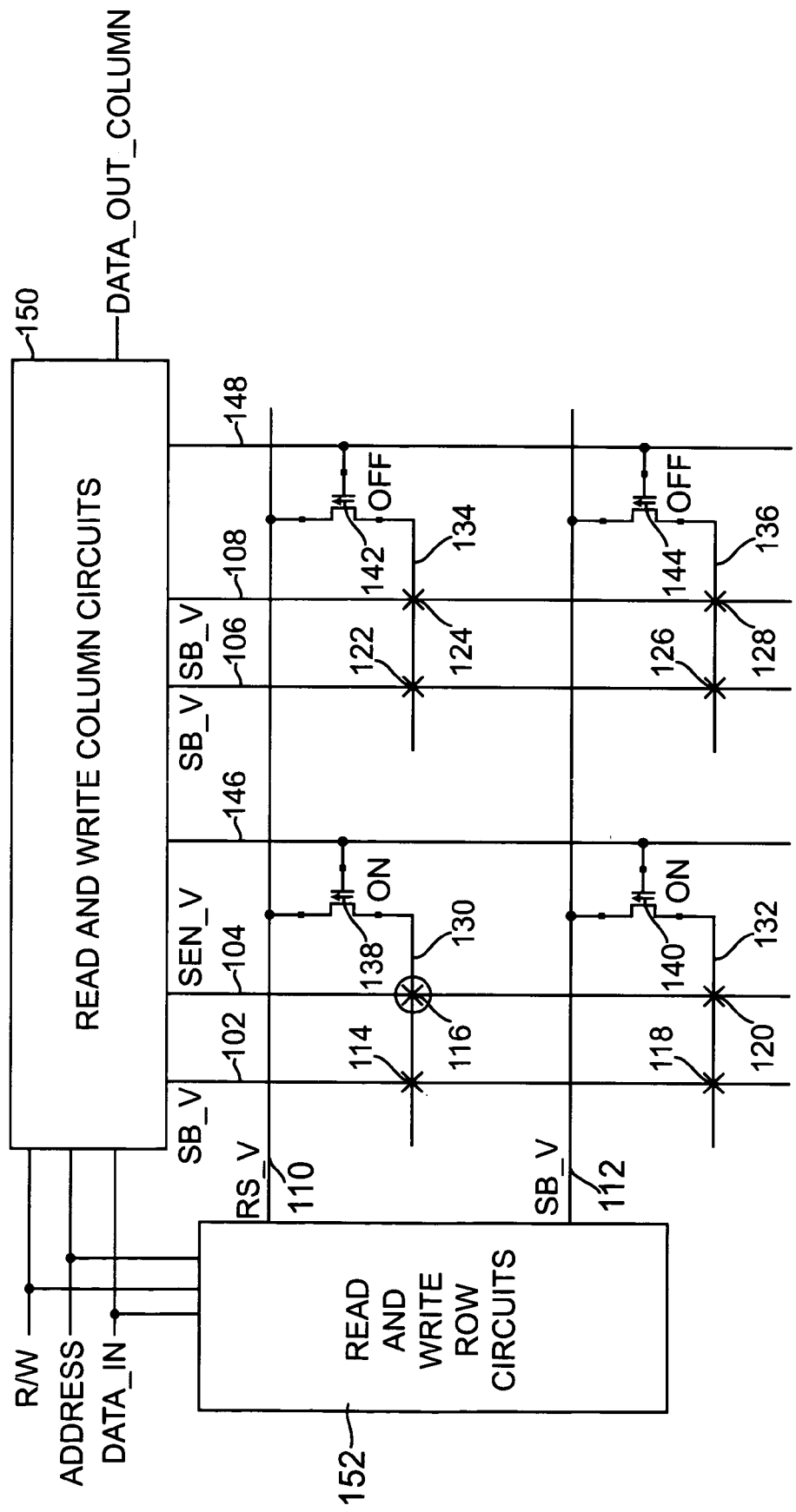
FIG. 5 is a schematic diagram depicting the illustrative cross-point memory shown in FIG. 1, configured for an exemplary read operation.

FIG. 5 is a schematic diagram depicting the exemplary cross-point memory 100 configured for a read operation, in accordance with the present invention. The read operation is generally well known by those skilled in the art. An exemplary read operation for a standard cross-point memory is described, for example, in the paper by Reohr et. al., entitled "Memories of Tomorrow," *IEEE Circuits and Devices Magazine*, Vol. 18, No. 5, pp. 17–27, September 2002, the disclosure of which is incorporated herein by reference. Consequently, a detailed discussion of the read operation of the cross-point memory 100 will not be presented herein. However, it should be noted that the illustrative segmentation techniques for isolating certain portions of the cross-point memory 100, as discussed in conjunction with the exemplary write operation shown in FIG. 2, can be similarly applied to the cross-point memory 100 during a read operation.

By way of example only, assume that a selected memory cell 116 in the cross-point memory 100 is to be read. In order to read the logical state of memory cell 116, the selection transistor 138 connected to the local row line 130 corresponding to the selected memory cell is enabled by asserting an active signal on global enable line 146, thereby connecting local row line 130 to global row line 110. The selected memory cell 116 is preferably read by applying the sense voltage SEN_V, generated by the column circuit 150, to global column line 104 corresponding to the selected memory cell, while applying the read select voltage RS_V, generated by the row circuit 152, to the corresponding global row line 110. The voltage across a given selected memory cell (e.g., 116) during the read operation is preferably chosen to be less than the voltage across a partially-selected memory cell during a write operation, which may be, for example, V/3 for the ⅓-method or V/2 for the ½-method, as previously described.

Asserting an active signal on the global enable line 146 will also activate the other selection transistors connected thereto, such as selection transistor 140, thereby connecting local row line 132 to corresponding global row line 112. Consequently, it is important that the other global row lines, such as global row line 112, be biased to substantially the same voltage sourced by the sense amplifier (not shown) in the column circuit 150 to which global column line 104 is connected. In this manner, partially-selected memory cells (e.g., memory cell 120) connected to the global column line 104 corresponding to the selected memory cell 116 will have a potential of zero volts across them, thus contributing substantially no current to the sense measurement during the read operation.

Since the partially-selected memory cells, such as memory cell 114, sharing local row line 130 with the selected memory cell 116 will also be biased to the read select voltage RS_V at one end, the global column lines, such as global column line 102, corresponding to these memory cells are preferably biased at the standby voltage potential SB_V. Global row lines, such as global row line 112, and global column lines, such as global column lines 102, 106 and 108, not connected to a selected memory cell (e.g., 116) are preferably set to the standby voltage SB_V, so as to prevent inadvertent reading of the corresponding unselected and/or partially-selected memory cells (e.g., memory cells 114, 118, 120, 122, 124, 126 and 128). In this manner, unselected memory cells will essentially have zero volts across their respective PCM elements, so as to reduce power consumption in the cross-point memory 100.

With reference again to FIG. 3, during a read operation of the exemplary cross-point memory 100 (see FIG. 1), the switch 302 is preferably configured so that terminal 303 is connected to the sense amplifier 306, for providing a sense signal (e.g., a current or voltage) to one or more selected memory cells and for reading the logical state of the selected memory cells. The sensed data is then provided to an output 307 of the sense amplifier 306, which is connected to the Data_Out_Column bus 160 in the exemplary cross-point memory 100 of FIG. 1. With reference again to FIG. 4, by way of example only, during a read operation, switch 402 is preferably configured so that terminal 403 is connected to read select voltage source 412. When terminal 403 is connected to a global row line corresponding to unselected memory cells, the switch 402 is preferably operative to connect the standby voltage source 406 to terminal 403.

Figure 6:
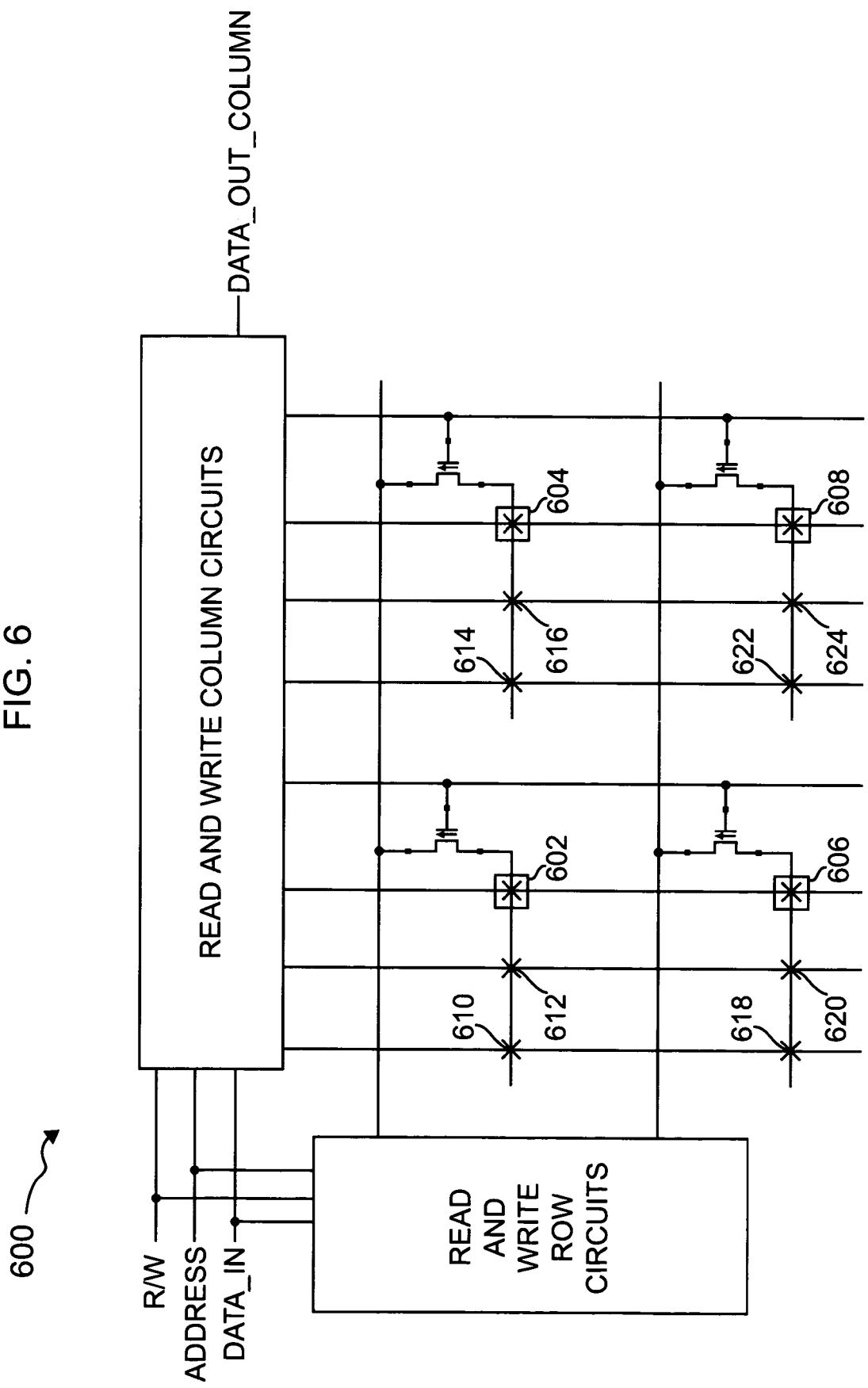
FIG. 6 is a schematic diagram depicting the illustrative cross-point memory shown in FIG. 1, configured such that at least one memory cell in each segmented group has a fixed low conductance state for maintaining standby voltages, in accordance with an aspect of the present invention.

FIG. 6 is a schematic diagram illustrating an exemplary cross-point memory 600, formed in accordance with another embodiment of the invention. Cross-point memory 600 may be configured in a manner similar to the cross-point memory 100 shown in FIG. 1, except that at least one of the nonvolatile memory elements along each local row line is always set to a high conductivity state so as to ensure that the local row line, when isolated from its corresponding global row line, charges more quickly and remains charged to an appropriate standby voltage. This approach may improve a cycle time of the memory and likewise guarantee safe and consistent read and write operations.

A high conductivity state of at least one of the nonvolatile memory elements, which can be represented as resistive elements, connected to a local row line advantageously guarantees a minimum resistance-capacitance (RC) charging time of the local row line from a given one of the global column lines corresponding to a selected memory cell connected to the local row line. A suitable methodology for implementing this technique, in accordance with an illustrative embodiment of the invention, involves using one or more nonvolatile memory cells in a sacrificial capacity, whereby the sacrificial memory cell(s), represented as boxed nonvolatile memory cells 602, 604, 606, 608 in the exemplary cross-point memory 600, do not store state but rather function to control a voltage potential of the local row line in a standby mode. The sacrificial memory cell(s) may take on a range of conductance values (e.g., by employing a different material type or by applying a different voltage for a different duration of time so as to change the crystalline structure of the material to obtain a desired conductivity value) not limited to the conductance values of memory cells 610, 612, 614, 616, 618, 620, 622, 624 in either a "0" or "1" state.

The techniques of the present invention described herein are not limited to the specific cross-point memory architecture shown in the figures. Rather, alternative memory arrangements may be similarly employed. Moreover, it is further contemplated that a single local row line (e.g., 110 or 112) in the exemplary cross-point memory 100 depicted in FIG. 1 may be connected to nonvolatile memory elements residing in multiple active layers in a three-dimensional memory chip (not shown), as will be understood by those skilled in the art. In this manner, a further beneficial increase in storage density may be obtained.

The exemplary cross-point memory of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A cross-point memory, comprising:
   a plurality of memory cells;
   a plurality of global word lines, at least a given one of the global word lines being configurable for conveying a write current for selectively writing a logical state of one or more of the plurality of memory cells;
   a plurality of local word lines, each of the local word lines being connected to at least one of the plurality of memory cells for assisting in writing a logical state of the at least one memory cell corresponding thereto;
   a plurality of selection circuits, each of the selection circuits being operative to electrically connect a given one of the local word lines to a given one of the global word lines in response to a control signal applied thereto;
   a plurality of global bit lines, each of the global bit lines being connected to at least one of the plurality of memory cells for writing a logical state of the at least one memory cell corresponding thereto;
   wherein the cross-point memory is configured such that during a write operation directed to at least one selected memory cell, the write current passes through the selected memory cell for writing the logical state of the selected memory cell.

2. The memory of claim 1, further comprising at least one column circuit connected to the plurality of global bit lines, and at least one row circuit connected to the plurality of global word lines, the column circuit and row circuit being operative to bias the global bits lines and global word lines, respectively, to corresponding desired voltage potentials for selectively reading and writing a desired subset of the memory cells.

3. The memory of claim 2, wherein the at least one column circuit comprises a plurality of voltage sources, at least one sense amplifier, and a switching circuit having an output coupled to a given one of the global bit lines, and having a plurality of inputs, each of the inputs being coupled to a given one of the plurality of voltage sources and the at least one sense amplifier, at least one of the voltage sources being a standby voltage source, the switching circuit being configurable for electrically connecting one of the inputs to the output in response to a control signal presented to the switching circuit.

4. The memory of claim 3, wherein the switching circuit, during a read operation, is configured to at least one of: (i) connect the at least one sense amplifier to the given global bit line; and (ii) connect the standby voltage source to the given global bit line.

5. The memory of claim 3, wherein the switching circuit, during a write operation, is configured to connect one of the plurality of voltage sources to the given global bit line.

6. The memory of claim 2, wherein the at least one column circuit comprises a programmable voltage source, at least one sense amplifier, and a switching circuit having an output coupled to a given one of the global bit lines, and having a first input coupled to the programmable voltage source and a second input coupled to the sense amplifier, the switching circuit being configurable for electrically connecting one of the inputs to the output in response to a first control signal presented to the switching circuit, the programmable voltage source being configurable for generating one of a plurality of voltage levels in response to a second control signal.

7. The memory of claim 2, wherein the at least one row circuit comprises a plurality of voltage sources and a switching circuit having an output coupled to a given one of the global word lines, and having a plurality of inputs, each of the inputs being coupled to a given one of the plurality of voltage sources, the plurality of voltage sources including a read select voltage source and a standby voltage source, the switching circuit being configurable for electrically connecting one of the inputs to the output in response to a control signal presented to the switching circuit.

8. The memory of claim 7, wherein the switching circuit, during a read operation, is configured to at least one of: (i) connect the read select voltage source to the given global word line; and (ii) connect the standby voltage source to the given global word line.

9. The memory of claim 7, wherein the switching circuit, during a write operation, is configured to connect one of the plurality of voltage sources to the given global word line.

10. The memory of claim 1, wherein during a write operation of a selected memory cell: (i) a given one of the global bit lines corresponding to the selected memory cell is biased at a voltage substantially equal to a write voltage V, and each of the global bit lines not corresponding to the selected memory cell is biased at a voltage of about V/3; and (ii) a given one of the global word lines corresponding to the selected memory cell is biased at about zero volts, and each of the global word lines not corresponding to the selected memory cell is biased at a voltage of about 2 V/3.

11. The memory of claim 1, wherein during a write operation of a selected memory cell: (i) a given one of the global bit lines corresponding to the selected memory cell is biased at a voltage substantially equal to a write voltage V, and each of the global bit lines not corresponding to the selected memory cell is biased at a voltage of about V/2; and (ii) a given one of the global word lines corresponding to the selected memory cell is biased at about zero volts, and each of the global word lines not corresponding to the selected memory cell is biased at a voltage of about V/2.

12. The memory of claim 1, wherein during a read operation of a selected memory cell: (i) a given one of the global bit lines corresponding to the selected memory cell is biased at a voltage substantially equal to a sense voltage, and each of the global bit lines not corresponding to the selected memory cell is biased at a standby voltage; and (ii) a given one of the global word lines corresponding to the selected memory cell is biased at a read select voltage, and each of the global word lines not corresponding to the selected memory cell is biased substantially at the standby voltage.

13. The memory of claim 1, wherein at least one of a plurality of memory cells connected to a given one of the local word lines is configured to remain in a high-conductivity state so as to control a resistance-capacitance charging time of the given local word line.

14. The memory of claim 1, wherein the at least one selection circuit comprises a transistor device having a first terminal connected to the given global word line, a second terminal connected to the given local word line, and a third terminal for receiving the control signal.

15. The memory of claim 1, wherein each of the plurality of memory cells comprises a phase change memory element, the phase change memory element being operable in one of at least two crystalline states, each of the crystalline states being representative of a logical state of the memory cell.

16. A cross-point memory array, comprising:
a plurality of memory cells;
a plurality of global word lines, at least a given one of the global word lines being configurable for conveying a write current for selectively writing a logical state of one or more of the plurality of memory cells;
a plurality of local word lines, each of the local word lines being connected to at least one of the plurality of memory cells for assisting in writing a logical state of the at least one memory cell corresponding thereto;
a plurality of selection circuits, each of the selection circuits being operative to electrically connect a given one of the local word lines to a given one of the global word lines in response to a control signal applied thereto;
a plurality of global bit lines, each of the global bit lines being connected to at least one of the plurality of memory cells for writing a logical state of the at least one memory cell corresponding thereto;
wherein the memory array is configured such that, during a write operation for writing at least a given one of the memory cells, global bit lines corresponding to unselected memory cells charge local word lines corresponding to the unselected memory cells to a standby voltage, whereby each of the unselected memory cells has substantially zero volts across it.

17. An integrated circuit device including at least one memory array, the at least one memory array comprising:
a plurality of memory cells;
a plurality of global word lines, at least a given one of the global word lines being configurable for conveying a write current for selectively writing a logical state of one or more of the plurality of memory cells;

a plurality of local word lines, each of the local word lines being connected to at least one of the plurality of memory cells for assisting in writing a logical state of the at least one memory cell corresponding thereto;

a plurality of selection circuits, each of the selection circuits being operative to electrically connect a given one of the local word lines to a given one of the global word lines in response to a control signal applied thereto;

a plurality of global bit lines, each of the global bit lines being connected to at least one of the plurality of memory cells for writing a logical state of the at least one memory cell corresponding thereto;

wherein the memory array is configured such that during a write operation directed to at least one selected memory cell, the write current passes through the selected memory cell for writing the logical state of the selected memory cell.

* * * * *